US009778983B2

(12) United States Patent
Engin et al.

(10) Patent No.: US 9,778,983 B2
(45) Date of Patent: Oct. 3, 2017

(54) INTEGRATED CIRCUIT DEVICE AND METHOD FOR REDUCING SRAM LEAKAGE

(71) Applicant: NXP B.V., Eindhoven (NL)

(72) Inventors: Nur Engin, Eindhoven (NL); Ajay Kapoor, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/820,417

(22) Filed: Aug. 6, 2015

(65) Prior Publication Data

US 2017/0039103 A1    Feb. 9, 2017

(51) Int. Cl.
*G11C 29/00* (2006.01)
*G06F 11/10* (2006.01)
*G11C 11/419* (2006.01)
*G11C 29/52* (2006.01)

(52) U.S. Cl.
CPC ........ *G06F 11/1068* (2013.01); *G06F 11/106* (2013.01); *G06F 11/1048* (2013.01); *G11C 11/419* (2013.01); *G11C 29/52* (2013.01)

(58) Field of Classification Search
CPC .... G06F 11/1068; G11C 29/52; G11C 11/419
See application file for complete search history.

(56) References Cited

U.S. PATENT DOCUMENTS

| | | |
|---|---|---|
| 5,428,956 A | 7/1995 | Maus et al. |
| 6,278,633 B1 | 8/2001 | Wong et al. |
| 7,043,679 B1 | 5/2006 | Keltcher et al. |
| 8,347,176 B2 | 1/2013 | Resnick et al. |
| 8,898,548 B1 | 11/2014 | Mullendore et al. |
| 9,424,952 B1 | 8/2016 | Seok et al. |
| 2004/0083334 A1 | 4/2004 | Chang et al. |
| 2005/0044467 A1 | 2/2005 | Leung et al. |
| 2008/0133994 A1 | 6/2008 | Oh |

(Continued)

FOREIGN PATENT DOCUMENTS

| | | |
|---|---|---|
| WO | WO 2009/032945 A1 | 3/2009 |
| WO | WO 2012/039983 A1 | 3/2012 |

OTHER PUBLICATIONS

Huifang Qin; "Deep Sub-Micron SRAM Design for Ultra-Low Leakage Standby Operation",EECS Department University of California, Berkeley, Technical Report No. UCB/EECS-2007-74, May 23, 2007.

(Continued)

*Primary Examiner* — Sam Rizk

(57) ABSTRACT

An integrated circuit (IC) device including an SRAM module coupled to wrapper logic is disclosed. The wrapper logic includes an error correction code (ECC) encoder configured to encode input data in accordance with an ECC encoding scheme and output the encoded input data to the SRAM module, an ECC decoder configured to decode output data received from the SRAM module, output the decoded output data, and write decoding information back to the SRAM module, an error controller coupled to the ECC decoder that is configured to control the ECC decoder in accordance with the ECC encoding scheme, and a central controller coupled to the components of the wrapper logic and the SRAM module in order to control operations between the components of the wrapper logic and the SRAM module.

15 Claims, 8 Drawing Sheets

(56) References Cited

U.S. PATENT DOCUMENTS

| | | |
|---|---|---|
| 2009/0043951 A1 | 2/2009 | Shalvi et al. |
| 2009/0125790 A1 | 5/2009 | Iyer et al. |
| 2009/0144598 A1 | 6/2009 | Yoon et al. |
| 2009/0193301 A1 | 7/2009 | Ito et al. |
| 2010/0165730 A1 | 7/2010 | Sommer et al. |
| 2011/0032758 A1 | 2/2011 | Son et al. |
| 2011/0047408 A1 | 2/2011 | Gille et al. |
| 2011/0302476 A1 | 12/2011 | Lee et al. |
| 2012/0324314 A1* | 12/2012 | Seshadri ............. G06F 11/1048 714/773 |
| 2013/0179751 A1 | 7/2013 | Linstadt |
| 2014/0047301 A1 | 2/2014 | Kurata |
| 2014/0068365 A1* | 3/2014 | Chen ..................... G06F 11/106 714/746 |
| 2016/0132391 A1 | 5/2016 | Thoen |

OTHER PUBLICATIONS

Berrou, C., Glavieux et al.; "Near Shannon limit error-correcting coding and decoding: Turbo-codes", ICC '93 Geneva, Conference Record, May 1993.
Gallager, R.G., "Low-Density Parity-Check Codes"; MIT Press, 1963., Low-Density Parity-Check Codes. MIT Press, 1963.
Shao, R.Y. et al.; "Two simple stopping criteria for turbo decoding"; IEEE Trans. Commun., vol. 47, pp. 1117-1120, Aug. 1999.
Li, J. et al.; "Early stopping for LDPC decoding: convergence of mean magnitude (CMM)", IEEE Communications Letters, vol. 10 , Issue: 9, 2006 , pp. 667-669.
European Search Report, 16180731.8, Nov. 9, 2016.
M. H. Abu-Rahma and M. Anis. "Nanometer Variation Tolerant SRAM", 5 DCI: 10.10071978-1-46141749-1_2 © Springer Science Business Media New York; 2013.
Gyepes, G. et al. "An On-chip Dynamic Supply Current Monitor for Testing of Digital Circuits", IEEE 23th Conference Radioelektronika 2013, pp. 156-161 (Apr. 16, 2013).
Hsiao, M. Y. "A Class of Optimal Minimum Odd-weight-column SEC-DED Codes", IBM Journal of Research and Development, vol. 14, No. 4, pp. 395-401 (Jul. 1970).
Zhao, K. et al. "LDPC-in-SSD: Making Advanced Error Correction Codes Work Effectively in Solid State Drives" Proceeding of the 11$^{th}$ USENIX conference on File and Storage Technologies (FAST'13), pp. 243-256 (Feb. 2013).
Motwani, R. et al. "Low Density Parity Check (LDPC) Codes and the Need for Stronger ECC", Intel, 18 pgs. (Aug. 2011).
Kobayashi, H. et al. "Alpha Particle and Neutron-inducded Soft Error Rates and Scaling Trends in SRAM", IEEE 47$^{th}$ Annual International Reliability Physics Symposim, Montreal, pp. 206-211 (2009).
Mukherjee, S. et al. "Cache Scrubbing in Microprocessors: Myth and Necessity?", 10$^{th}$ International Symposium on Pacific Rim Dependable Computing, pp. 1-6 (Mar. 2004).
"ECC Memory", Wikipedia, 11 pgs., retrieved from the internet 4-22-215 at: http://en.wikipedia.org/wiki/ECC_memory.
Scheick, L.Z. et al. "SEU Evaluation of SRAM Memories for Space Applications", IEEE Trans. Nuclear Science, 3 pgs. (2001).
"Memory scrubbing", Wikipedia, 3 pgs., retrieved from the internet at Jul. 28, 2014: http://en.wikipedia.org/wiki/Memory_scrubbing.
Mavis, D.G. et al. "Multiple Bit Upsets and Error Mitigation in Ultra Deep Submicron SRAMs", Microelectronics Research Development Corporation, 12 pgs. (Jul. 17, 2008).
Kou, Y. et al. "Low Density Parity Check Codes Based on Finite Geometries: A Rediscovery and New Results", IEEE Transactions on Information Theory, vol. 47, No. 7, pp. 2711-2736 (Nov. 2001).
Paccagnella, A. "Single Event Effects: SRAM", Dipartimento di Ingegneria dell'Informazione Universita di Padova, 33 pgs., retrieved from the internet at: sirad.pd.infn.it/scuola_legnaro_2007/Presentazioni . . ./12_Paccagnella_ParteB.pdf (Mar. 29, 2007).
Baumann, R. C. "Radiation-Induced Soft Errors in Advanced Semiconductor Technologies", IEEE Transactions on Device and Materials Reliability, vol. 5, No. 3, pp. 305-316 (Sep. 2005).
Extended European Search Report for Patent Appln. No. 16180731.8 (dated Mar. 10, 2017).
Extended European Search Report for Patent Appln. No. 16180733.4 (dated Nov. 17, 2016).
Extended European Search Report for Patent Appln. No. 16180734.2 (dated Nov. 22, 2016).

* cited by examiner

INTEGRATED CIRCUIT DEVICE AND METHOD FOR REDUCING SRAM LEAKAGE

BACKGROUND

Static random access memory (SRAM) utilizes transistors to retain bits of data in a memory array. In order to retain the bits of data, a voltage is applied to the SRAM. Traditionally, the amount of voltage needed to retain bits of data accurately and compensate for SRAM leakage is referred to as the data retention voltage (DRV). In low-power devices, the DRV needed to compensate for SRAM leakage can significantly contribute to the total power consumption of the device.

SUMMARY

In accordance with an embodiment of the invention, an integrated circuit (IC) device is disclosed. In the embodiment, the IC device includes an SRAM module, the SRAM module including at least one transistor, and wrapper logic coupled to the SRAM module, the wrapper logic including an error correction code (ECC) encoder coupled to SRAM module, wherein the ECC encoder is configured to encode input data in accordance with an ECC encoding scheme and output the encoded input data to the SRAM module, an ECC decoder coupled to the SRAM module, wherein the ECC decoder is configured to decode output data received from the SRAM module, output the decoded output data, and write decoding information back to the SRAM module, an error controller coupled to the ECC decoder that is configured to control the ECC decoder in accordance with the ECC encoding scheme, and a central controller coupled to the error controller and the ECC encoder, wherein the central controller is configured to control operations between the ECC encoder, ECC decoder, error controller, and the SRAM module.

In another embodiment, the ECC decoder is coupled to the SRAM module such that the ECC decoder can be bypassed while the SRAM module is in a dynamic mode.

In another embodiment, the ECC decoder is further coupled to an error map in the SRAM module and the ECC decoder is configured to write back decoding information to the error map.

In another embodiment, the ECC decoder is further coupled to parity cells in the SRAM module and the ECC decoder is configured to store error correction codes corresponding to memory words of the input data in the parity cells.

In another embodiment, the wrapper logic is coupled to the SRAM module such that the SRAM module can operate independent of the wrapper logic.

In a second embodiment, a method for reducing SRAM leakage in an IC device that includes SRAM memory is disclosed. In the embodiment, the method involves receiving input data, encoding the received input data, storing the encoded input data in an SRAM module, entering standby mode, scrubbing the data stored in the SRAM module while in standby mode, exiting standby mode, decoding the data stored in the SRAM module, performing error correction on the decoded data, outputting the error-corrected decoded data, and writing information regarding the error correction to the SRAM module.

In another embodiment, standby mode is entered by reducing supply voltage applied to the SRAM module to a lower voltage than the voltage needed for data retention.

In another embodiment, information regarding the error correction includes at least one of information about where errors occurred in the data and weak cells within the SRAM module.

In another embodiment, information regarding the error correction is written back to an error map and used to identify weak cells.

In another embodiment, information regarding the error correction includes the error-corrected decoded data.

In another embodiment, encoding the received input data comprises extending memory words of the input data to include an error correcting code.

In another embodiment, the SRAM module enters and exits standby mode in response to a signal generated by a finite state machine implemented in a central controller.

In another embodiment, decoding the data output from the SRAM module comprises scrubbing the data in the SRAM module for errors.

In another embodiment, scrubbing the data in the SRAM module for errors utilizes one data block with a size equal to the size of the SRAM module.

In another embodiment, scrubbing the data in the SRAM module for errors utilizes several data blocks equal to a fraction of the size of the SRAM module.

In another embodiment, writing information regarding the error correction to the SRAM module comprises storing a list of addresses of bits that are identified as weak in circuitry on the SRAM module.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
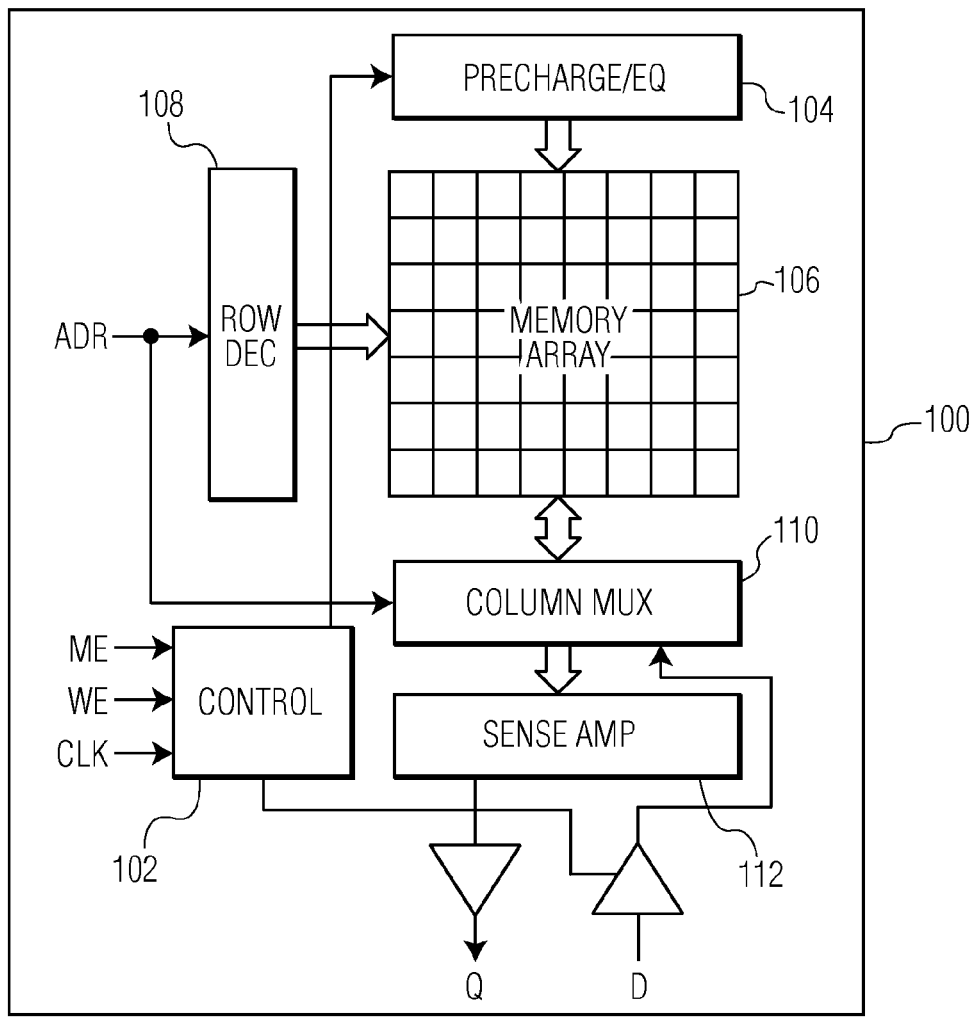
FIG. 1 illustrates a configuration of an SRAM module.

FIG. 1 illustrates a configuration of an SRAM module 100. The SRAM module includes a control circuit 102, a charge source 104 ("PRECHARGE/EQ"), a memory array 106, a row decoder 108, a column multiplexer 110, and a sense amplifier 112. The control circuit is configured to determine if data is being written to or read from the memory array. In an embodiment, the memory array is an array of six transistor SRAM cells. In order to read from or write to the cells in the memory array, the charge source precharges one or more bitlines within each cell. The row decoder is used to select cells to write to and, in conjunction with the column multiplexer, to read stored data from select cells. Unlike DRAM, the data stored in each cell of an SRAM module can be sustained without regularly refreshing the data so long as sufficient power remains available to the memory array. In an embodiment, the minimum sufficient power to sustain data in SRAM is referred to as the data-retention voltage (DRV).

Figure 2:
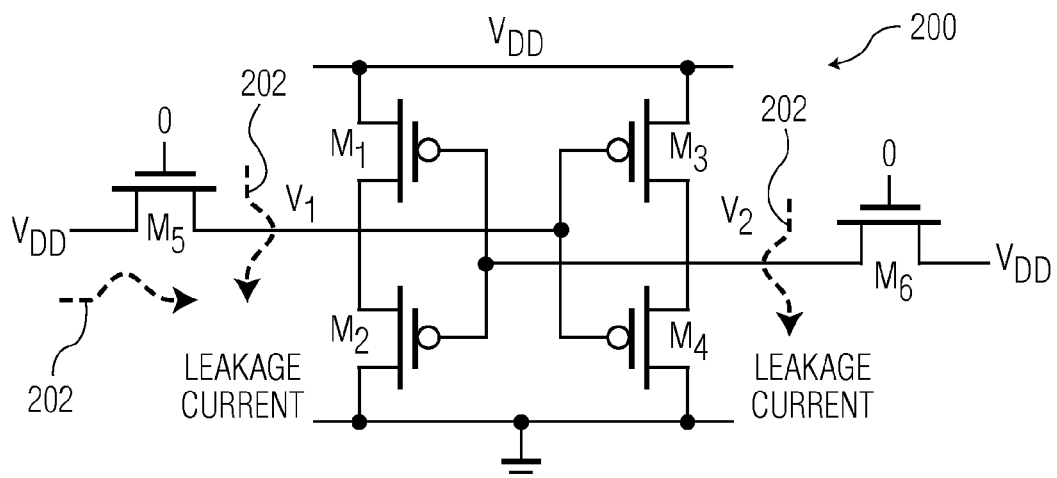
FIG. 2 depicts a circuit diagram of a memory cell in an SRAM module.

FIG. 2 depicts a circuit diagram of a cell 200 in an SRAM module. Transistors $M_1$-$M_6$ can be opened or closed in the operation of storing charge within the cell. As long as the supply voltage provided to the SRAM module stays above the DRV, the bit stored within the cells of the SRAM module can be reliably sustained. If the supply voltage is decreased below the DRV, charge within the SRAM module may change and the bit stored within the cells of the SRAM module can become unreliable. Thus, the power demand of an SRAM module during data retention mode is largely determined by the DRV. In an embodiment, the DRV is impacted by leakage (loss of energy from charged capacitors within the transistors), as indicated by the dash line arrows 202. Voltage lower than the DRV can be applied to the SRAM memory, but doing so increases the chance for the stored bit to become unreliable.

Figure 3:
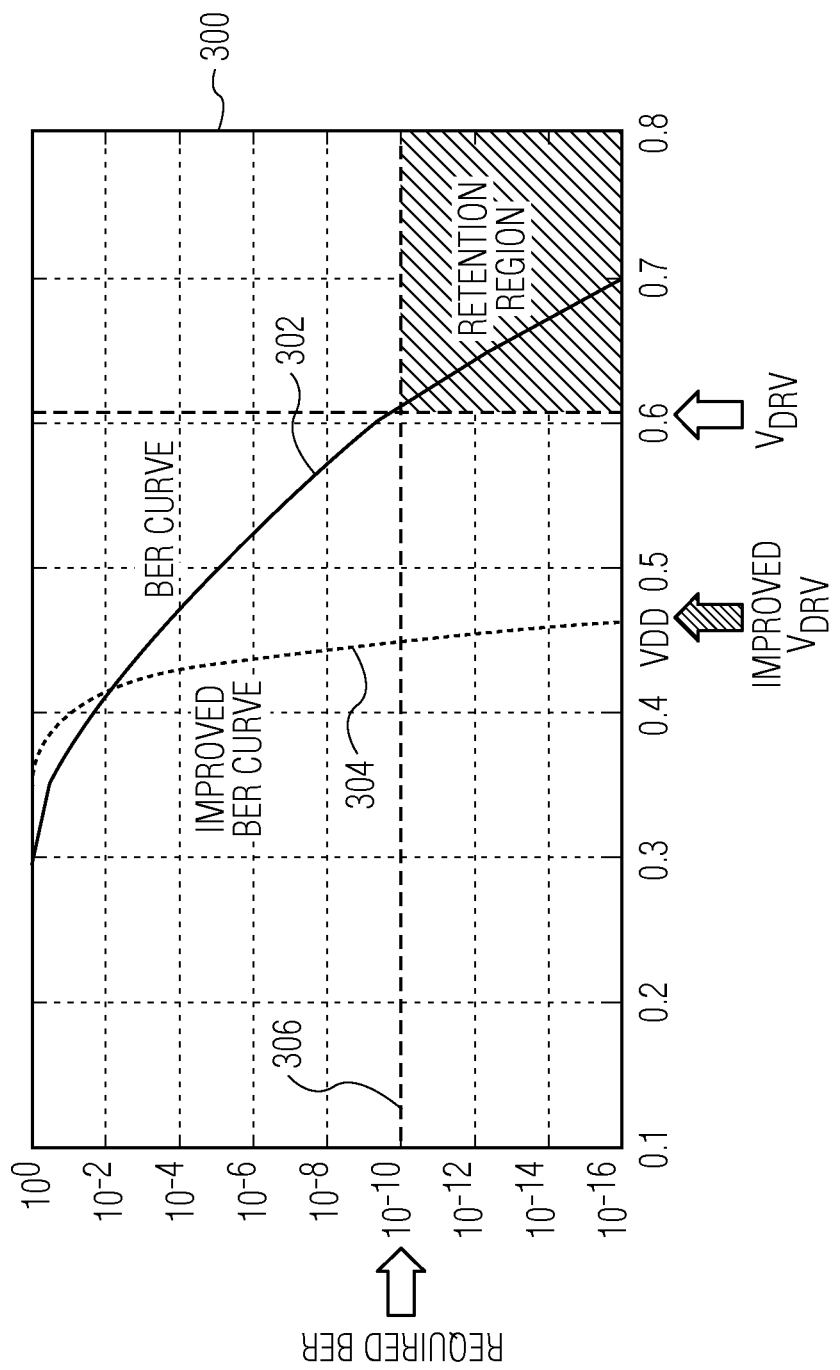
FIG. 3 is a plot of bit error rates (BER) of stored data measured across a range of DRVs.

In order to utilize a supply voltage lower than the DRV, error correction can be applied to data to be stored in an SRAM module by, for example, adding redundant bits and to data read from the SRAM module by, for example, decoding the redundant bits. FIG. 3 is a plot 300 of bit error rates (BER) of stored data measured across a range of DRVs. The plot indicates a curve when error correction is not used 302, a curve when error correction is used 304, and a threshold BER 306 under which data must stay in order to be reliable. As indicated by the plot, when error correction is not used, the DRV must remain higher, to keep the BER above the threshold, than when error correction is used. Accordingly, by utilizing error correction, the DRV can be reduced and less voltage will need to be supplied to the SRAM module to sustain reliable charge in the SRAM cells.

In operation, an "off-the-shelf" SRAM module design (commonly referred to as "memory IP") is often purchased from a third party and incorporated into the design of an IC device such as a microcontroller. For example, the same SRAM module design can be used in memory for an ARM microcontroller and for a MIPS microcontroller. Typically, the SRAM module design cannot be easily modified. Additionally, SRAM module designs are typically not configured to use error correction.

In accordance with an embodiment of the invention, an integrated circuit (IC) device is disclosed. In the embodiment, the IC device includes an SRAM module, the SRAM module including at least one transistor, and wrapper logic coupled to the SRAM module, the wrapper logic including an error correction code (ECC) encoder coupled to SRAM module, wherein the ECC encoder is configured to encode input data in accordance with an ECC encoding scheme and output the encoded input data to the SRAM module, an ECC decoder coupled to the SRAM module, wherein the ECC decoder is configured to decode output data received from the SRAM module, output the decoded output data, and write decoding information back to the SRAM module, an error controller coupled to the ECC decoder that is configured to control the ECC decoder in accordance with the ECC encoding scheme, and a central controller coupled to the error controller and the ECC encoder, wherein the central controller is configured to control operations between the ECC encoder, ECC decoder, error controller, and the SRAM module. In an embodiment, the decoding information written back to the SRAM module is the error-corrected output data. The write back is performed at regular intervals in order to maintain the data in the SRAM module and to avoid total data corruption. Thus, by coupling an SRAM module to wrapper logic that includes error correction components, an IC device can be fabricated with an "off-the-shelf" SRAM module design and error correction to produce an IC device with low DRV.

Figure 4:
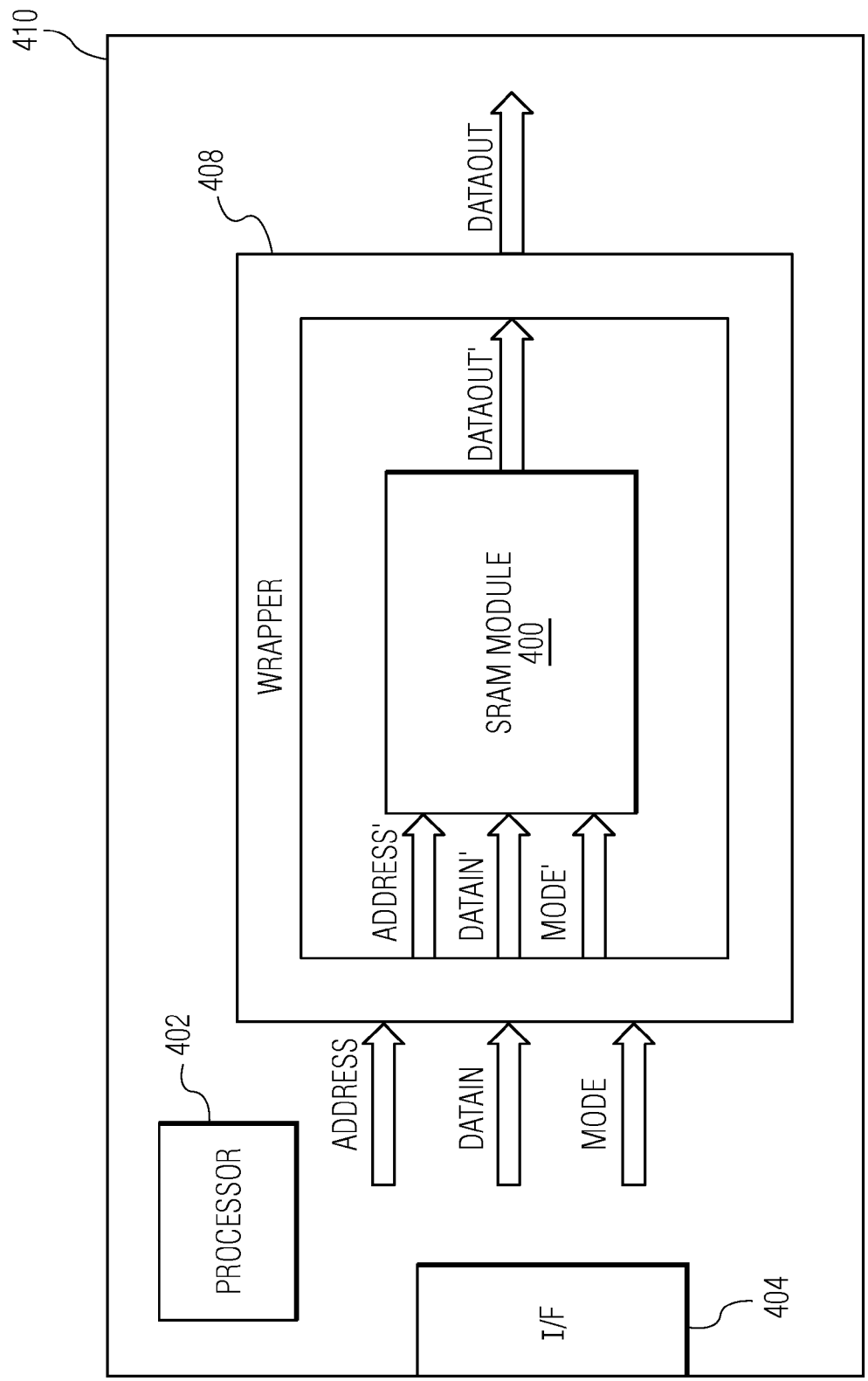
FIG. 4 FIG. 4 depicts an IC device that includes a processor, an interface, an SRAM module and a wrapper logic in accordance with an embodiment of the invention.

FIG. 4 depicts an IC device 410 that includes a processor 402, an interface 404, an SRAM module 400, and wrapper logic 408 in accordance with an embodiment of the invention. In an embodiment, the IC device is a microcontroller having an ARM processor and a serial interface such as an I2C interface, although other interfaces, including a wireless interface, are possible. In an embodiment, the interface has three main inputs (e.g., address, datain, and mode) and is coupled to the processor and the processor is coupled to the SRAM module and to the wrapper logic. In an embodiment, when data is to be stored in the SRAM module, an address, a mode signal (e.g., dynamic mode or standby mode or which type of ECC should be used), and the data (e.g., as a single value or as individual values) are received by the interface, passed to the processor, and then passed to the wrapper logic. In an embodiment, multiple SRAM modules can be associated with a single wrapper logic. In an embodiment, the mode can be fixed in the wrapper logic. In response to the mode signal, the wrapper logic performs data encoding and passes the encoded data to the SRAM module to store at the address. When data needs to be accessed, the SRAM module passes the data from the SRAM module to the wrapper logic and the wrapper logic decodes the data, performs error correction, and outputs the data to the interface for further use (e.g., by an application using the SRAM module for data storage) outside of the IC device. In another embodiment, the address, mode signal, and data can originate from within the IC device and pass to the processor, rather than be first received by the interface, and the data can be output to another component within the IC device, rather than to the interface. In an embodiment, the wrapper logic and the SRAM module operate independently of each other. Thus, the wrapper logic can be bypassed from the dataflow (e.g., by opening or closing switches to route signals around the wrapper logic via alternative circuitry) and the SRAM module can be written to or read from without utilizing the wrapper logic. For example, data can be stored and accessed from the SRAM module without powering the wrapper. Thus, the SRAM module can be written to or read from without utilizing the wrapper logic.

Figure 5A:
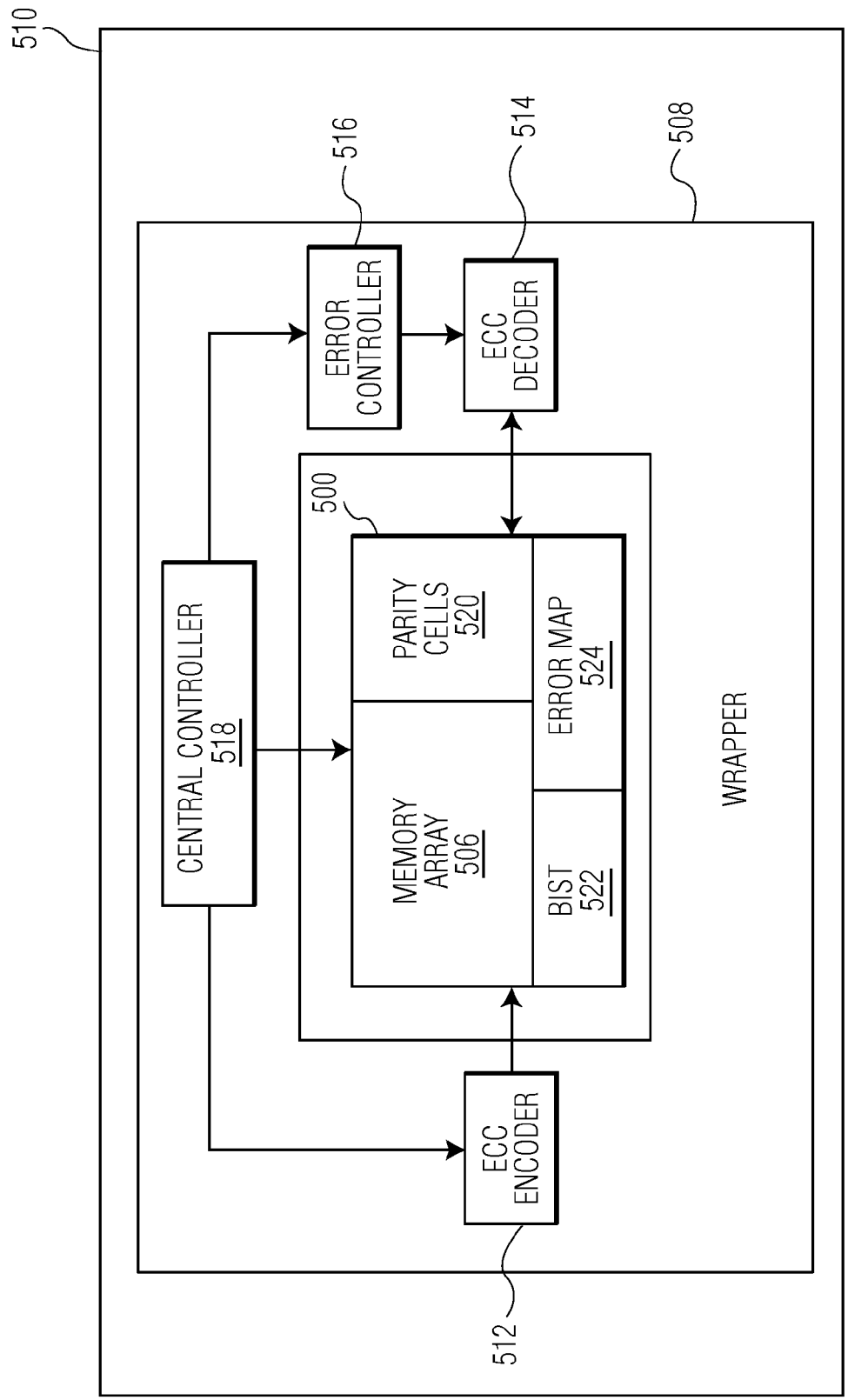
FIG. 5A depicts an embodiment of the SRAM module and the wrapper logic of FIG. 4.

FIG. 5A depicts an embodiment of an IC device 510 that includes an SRAM module 500 and wrapper logic 508. In the embodiment, the wrapper logic includes an ECC encoder 512, an ECC decoder 514, an error controller 516, and a central controller 518. In an embodiment, the IC device further includes an interface and a processor (not shown) and the ECC encoder, ECC decoder, error controller, and central controller can be implemented, at least, by circuits that include arithmetic logic units (ALUs) within an execution unit of the IC device and/or in part by the processor. For example, the ECC encoder and ECC decoder can be implemented with dedicated hardware (e.g., finite-state machines), but could also be implemented in programmable hardware or firmware and could be combined into a single encoder/decoder block. In an embodiment, the SRAM module includes a memory array 506 and can optionally further include parity cells 520, a built-in self-test (BIST) module 522, and an error map 524. In an embodiment, the ECC encoder is coupled to the SRAM module (for example, the memory array), the SRAM module is further connected to the ECC decoder, and the ECC decoder is further coupled to the error controller. The central controller is coupled to and controls the ECC encoder, the error controller, and the SRAM module.

Figure 5B:
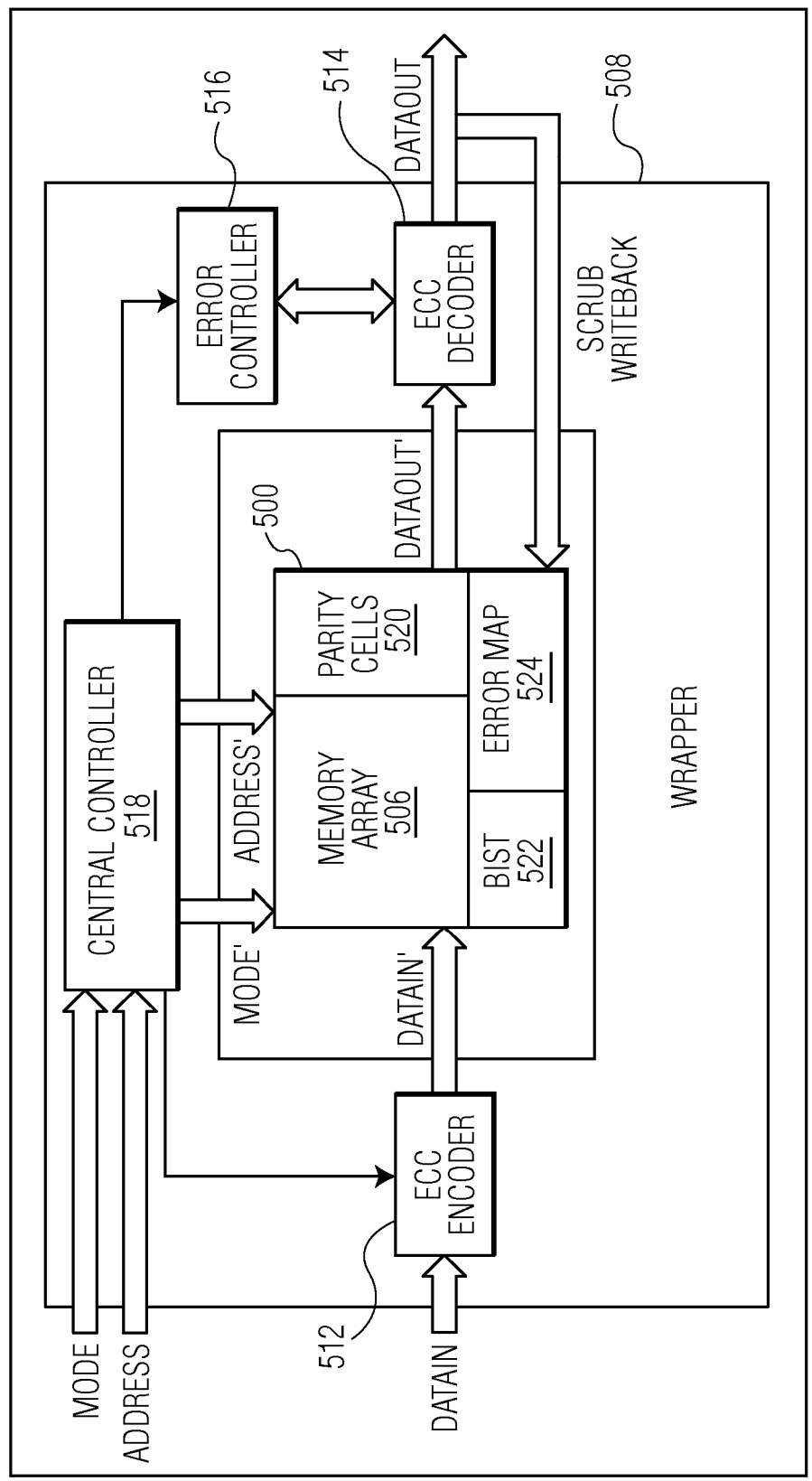
FIG. 5B illustrates the SRAM module and the wrapper logic of FIG. 5A in operation.

FIG. 5B illustrates the SRAM module 500 and the wrapper logic 508 of FIG. 5A in operation. When data is to be stored, the data (datain), an address (address), and a mode signal (mode) are sent to the wrapper logic. In an embodiment, the wrapper logic receives the data, address, and mode signal and is configured to send the data to the ECC encoder 512 and the mode signal and address to the central controller 518. Based on the address, the central controller determines in which cells of the memory array 506 the data is to be stored and, based on the mode indicated by the mode signal, the central controller determines an encoding scheme to use and if the ECC encoder and/or the ECC decoder 514 should be enabled. For example, if the mode signal indicates that the SRAM module should enter standby mode, then the ECC encoder will be enabled to encode the data in accordance with an ECC encoding scheme and if the mode signal indicates that the SRAM module should exit standby mode then the ECC decoder will be enabled to decode and correct the encoded data stored in the SRAM module in accordance with the ECC encoding scheme. In an embodiment, the ECC encoder and decoder can use different types of error correction codes including hamming codes, BCH codes, Reed Solomon codes, turbo codes, or low-density parity-check (LDPC) codes. In an embodiment, the central controller configures the ECC encoder and the error controller for a given ECC encoding scheme. The error controller then controls the ECC decoder to decode data in accordance with the ECC encoding scheme. In an embodiment, if the central controller configures the ECC encoder and/or ECC decoder with an on-the-fly ECC encoding scheme, then the ECC encoder encodes incoming data and the ECC decoder decodes outgoing data as described below with reference to FIGS. 6A and 6B. In an embodiment, if the central controller configures the ECC encoder and/or ECC decoder with a scrubbing ECC encoding scheme, then incoming data passes through to the SRAM module without encoding, but, when the SRAM module enters a standby mode, data in the SRAM module is encoded and, when the SRAM module leaves standby mode, data is decoded and written back to the SRAM module (e.g., scrubbed). In an embodiment, if the central controller configures the ECC encoder and/or ECC decoder with a hybrid on-the-fly/scrubbing ECC encoding scheme, then the ECC encoder encodes the data, but the ECC decoder only decodes and error-corrects the data if the SRAM module has entered the standby mode since the encoded data was stored. In an embodiment, data can be refreshed or scrubbed while the SRAM module is in standby mode by decoding the data, error-correcting the data, re-encoding the data, and writing the data back to the SRAM module at regular intervals. By refreshing the data at regular intervals, the accumulation of errors is reduced and the data is less likely to become unrecoverable. In an embodiment, the ECC decoder is also configured to determine the state of cells in the SRAM (e.g., if cells in the SRAM module are weak or otherwise unable to store data) and to write information regarding the state of the cells back to an error map 524 stored in the SRAM module. The ECC decoder can determine the state of a cell by, for example, tracking the number of times a bit that the cell is storing needs to be corrected (e.g., should be a 1, but reads as a 0) during decoding and error-correction. For example, if after four refresh attempts, a bit stored in a particular cell has needed correcting each attempt, the ECC decoder can determine that the particular cell is weak and pass information regarding the state of the particular cell back to the SRAM module to be stored in the error map.

Figure 6A:
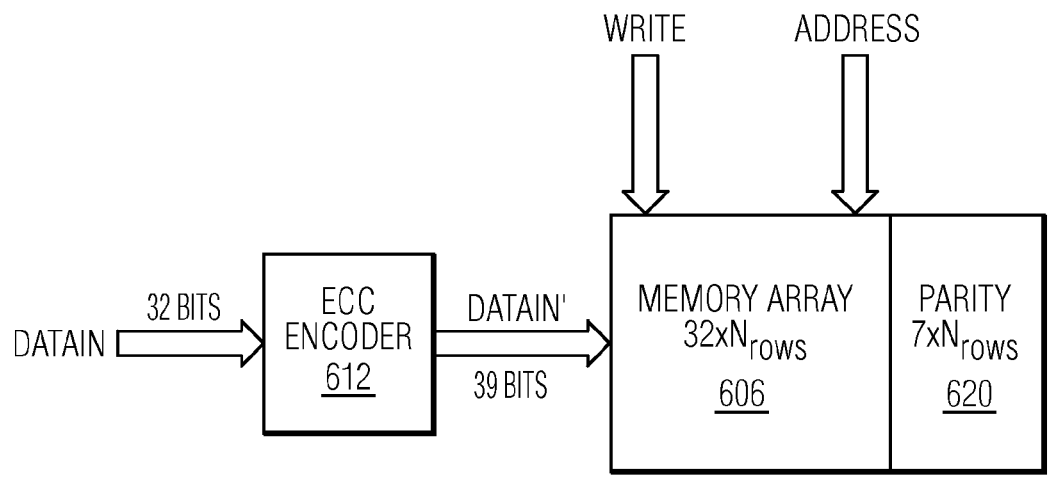
FIGS. 6A and 6B illustrate embodiments of data flow when the SRAM module and the wrapper logic utilize an on-the-fly ECC encoding scheme.
Figure 6B:
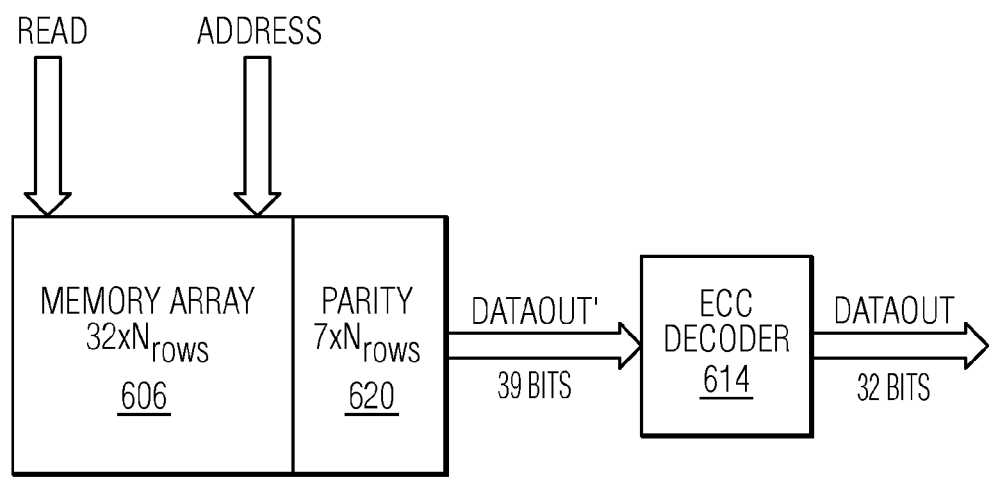

FIGS. 6A and 6B illustrate embodiments of data flow when the SRAM module and the wrapper logic utilize an on-the-fly ECC encoding scheme. FIG. 6A illustrates a write operation. In the example of FIG. 6A, a 32-bit data word is received and, as described with reference to FIG. 5B, the 32-bit data word is passed to an ECC encoder 612. The ECC encoder generates 7 parity bits and passes the new 39-bit data word to a memory array 606. The memory array receives signals directing the memory array to write the data word to cells in the memory array at a particular address. The memory array then stores the first 32-bits at the particular address and stores the 7 parity bits in the corresponding parity cells 620. Thus, the memory array stores ECC encoded data without being configured to perform the ECC encoding itself.

FIG. 6B illustrates a read operation. A memory array 606 receives signals directing the memory array to read a data word from a particular address. The memory array retrieves a 32-bit word plus 7 parity bits corresponding to the word from the particular address and corresponding parity cells 620 and passes the 39 bits to an ECC decoder 614. The ECC decoder uses the 7 parity bits to perform error correction on the data word and then outputs the corrected 32-bit data word. Thus, data words stored in the memory array can be error-corrected before being output without the memory array being configured to perform the ECC decoding itself. In other embodiments, data words can be of lengths other than 32-bits and more or fewer than 7 bits can be used for parity.

Figure 7:
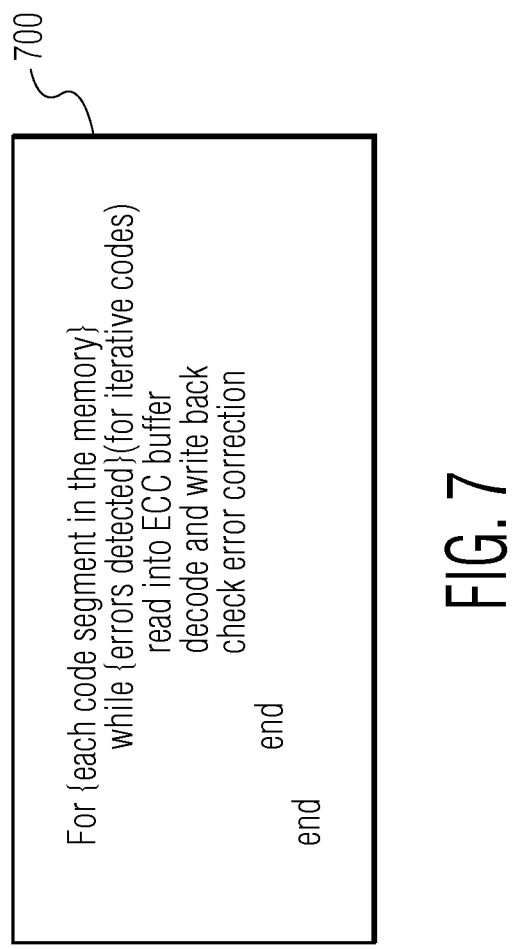
FIG. 7 depicts pseudo-code for decoding stored data when an SRAM module returns from standby mode to dynamic mode.

If a scrubbing ECC encoding scheme is used in place of the on-the-fly ECC encoding scheme, as described with reference to FIGS. 6A and 6B, then data stored in an SRAM module is not encoded until the SRAM module enters standby mode and the data is not decoded until the SRAM module returns to dynamic mode. That is, the ECC decoder is bypassed when the SRAM module is in dynamic mode (e.g., when read/write operations are being performed) or standby mode (e.g., when no read/write operations are being performed), but is utilized during the transition of the SRAM module from dynamic mode to standby mode and from standby mode to dynamic mode. FIG. 7 depicts pseudo-code 700 for decoding stored data when an SRAM module returns from standby mode to dynamic mode. In an embodiment, the pseudo-code is stored in the central controller, but could be stored elsewhere in the IC device. In an embodiment, data stored in the SRAM module can be treated as one data block with a size equal to the size of the SRAM module or as several data blocks equal to a fraction of the size of the SRAM module. By using a larger block of data (e.g., one data block with a size equal to the size of the SRAM module), more effective error-correction can be performed. By using a smaller block of data, data needed sooner (e.g., at startup) can be scrubbed first and the rest of the data can be scrubbed after. As indicated by the pseudo-code, the first step is to read a block of data from the SRAM module into a buffer in an ECC decoder. The ECC decoder then decodes and error-corrects the block of data before writing the corrected data back to the SRAM module and checking that the error correction was successful. In an embodiment, if too many errors for error-correction are detected, the data block is flagged by the central controller.

Figure 8:
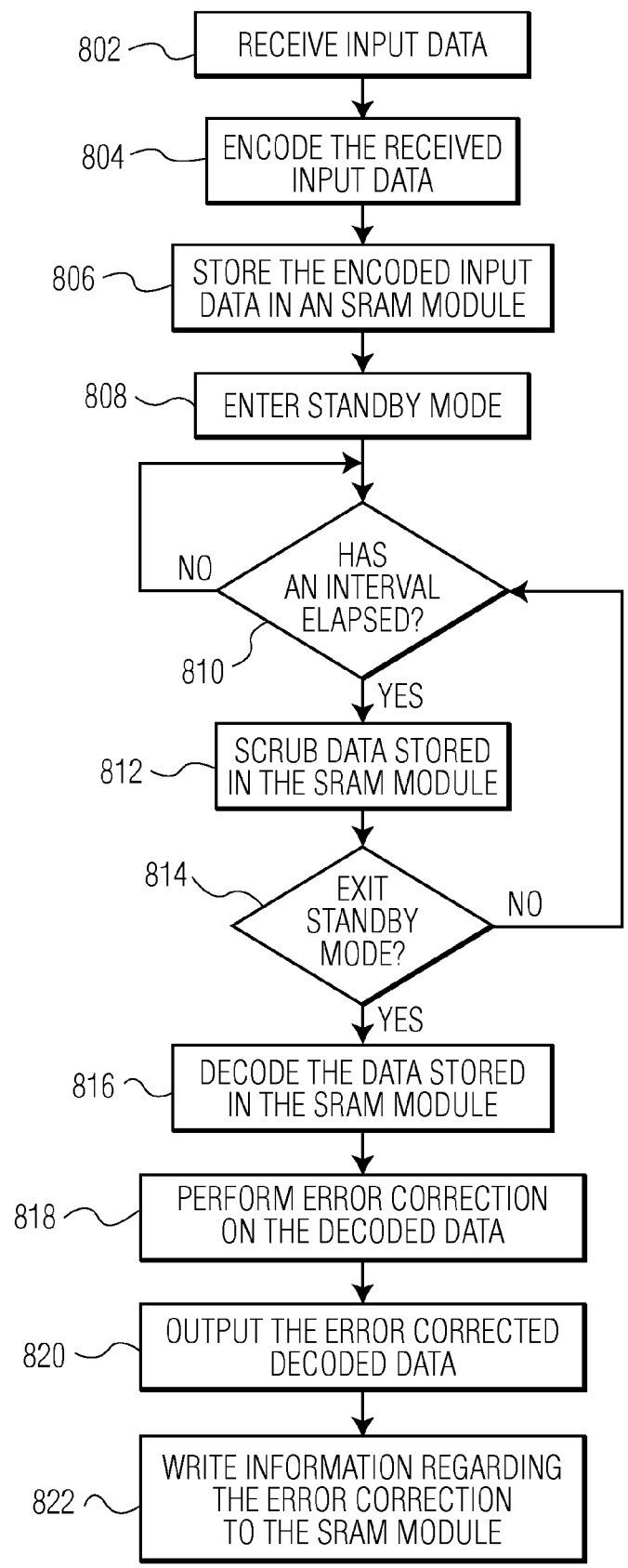
FIG. 8 is a process flow diagram of a method for reducing SRAM leakage in accordance with an embodiment of the invention.

FIG. 8 is a process flow diagram of a method for reducing SRAM leakage in accordance with an embodiment of the invention. At block 802, the SRAM module and wrapper logic receive input data. At block 804, the received input is encoded and, at block 806, the encoded data is stored in the SRAM module. At block 808, the SRAM module enters standby mode. In an embodiment, standby mode is entered by reducing voltage supplied to the SRAM module to a lower voltage than is needed for data retention. At decision point 810, if an interval of time has elapsed then, at block 812, the data stored in the SRAM module is scrubbed. For example, the interval could be on the order of >100 µs, but could also be any other time interval that is determined to be shorter than the time period in which errors can be expected to occur as determined by memory tests. At decision point 814, it is determined if the SRAM module should exit standby mode (e.g., has a request to perform a read or write operation been received). If the SRAM module should not exit standby mode (e.g., no request has been received), then the flow returns to decision point 810. If the SRAM module should exit standby mode (e.g., a read or write request has been received), then, at block 816, the data stored in the SRAM module is decoded and, at block 818, error correction is performed on the decoded data. At block 820 the error-corrected data is output and, at block 822, information regarding the error correction is written back to the SRAM module. In an embodiment, the information written back to the SRAM module can be facilitated by a built-in self-test (BIST) on the SRAM module facilitated either by hardware (e.g., additional circuitry on the SRAM module) or by software (e.g., software configuration of part of the SRAM module). If the BIST is facilitated by hardware, then, for example, a list of addresses of bits that are identified as weak can be stored in additional circuitry of the SRAM module. If the BIST is facilitated by software, then, for example, a table of bits and a health status corresponding to each bit (e.g., strong or weak) can be written to the SRAM memory.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, as described herein.

Furthermore, embodiments of at least portions of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. Examples of a computer-readable medium include a semiconductor or solid state memory, magnetic tape, a removable computer diskette, a random access memory (RAM), a read-only memory (ROM), a rigid magnetic disc, and an optical disc. Current examples of optical discs include a compact disc with read only memory (CD-ROM), a compact disc with read/write (CD-R/W), a digital video disc (DVD), and a Blu-ray disc.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An integrated circuit (IC) device comprising:
   a static random access memory (SRAM) module; and
   wrapper logic coupled to the SRAM module, the wrapper logic comprising:
   an error correction code (ECC) encoder coupled to the SRAM module, wherein the ECC encoder is configured to:
      encode input data in accordance with an ECC encoding scheme; and
      output the encoded input data to the SRAM module;
   an ECC decoder coupled to the SRAM module, wherein the ECC decoder is configured to:
      decode output data received from the SRAM module;
      output the decoded output data; and
      write decoding information back to the SRAM module;
   an error controller coupled to the ECC decoder that is configured to control the ECC decoder in accordance with the ECC encoding scheme; and
   a central controller coupled to the error controller and to the ECC encoder, wherein the central controller is configured to control operations between elements of the wrapper and the SRAM;
   wherein the ECC decoder is further coupled to an error map in the SRAM module and the ECC decoder is configured to write back decoding information to the error map, wherein the decoding information comprises information regarding the state of cells of the SRAM module, including the number of times a bit that a cell is storing needs to be corrected.

2. The IC device of claim 1, wherein the ECC decoder is coupled to the SRAM module such that the ECC decoder can be bypassed while the SRAM module is in a dynamic mode.

3. The IC device of claim 1, wherein the ECC decoder is further coupled to parity cells in the SRAM module and the ECC decoder is configured to store error correction codes corresponding to memory words of the input data in the parity cells.

4. The IC device of claim 1, wherein the wrapper logic is coupled to the SRAM module such that the SRAM module can operate independent of the wrapper logic.

5. A method for reducing SRAM leakage in an IC device that includes SRAM memory, the method comprising:
   receiving input data;
   encoding the received input data;
   storing the encoded input data in an SRAM module;
   entering standby mode, wherein standby mode is entered by reducing supply voltage applied to the SRAM module to a lower voltage than the voltage needed for data retention;
   scrubbing the data stored in the SRAM module while in standby mode;
   exiting standby mode;
   decoding the data stored in the SRAM module;
   performing error correction on the decoded data;
   outputting the error-corrected decoded data; and
   writing information regarding the error correction to the SRAM module.

6. The method of claim 5, wherein information regarding the error correction includes at least one of information about where errors occurred in the data and weak cells within the SRAM module.

7. The method of claim 5, wherein information regarding the error correction is written back to an error map and used to identify weak cells.

8. The method of claim 5, wherein information regarding the error correction includes the error-corrected decoded data.

9. The method of claim 5, wherein encoding the received input data comprises extending memory words of the input data to include an error correcting code.

10. The method of claim 5, wherein the SRAM module enters and exits standby mode in response to a signal generated by a finite state machine implemented in a central controller.

11. The method of claim 5, wherein decoding the data output from the SRAM module comprises scrubbing the data in the SRAM module for errors.

12. The method of claim 11, wherein scrubbing the data in the SRAM module for errors utilizes one data block with a size equal to the size of the SRAM module.

13. The method of claim 11, wherein scrubbing the data in the SRAM module for errors utilizes several data blocks equal to a fraction of the size of the SRAM module.

14. The method of claim 5, wherein writing information regarding the error correction to the SRAM module comprises storing a list of addresses of bits that are identified as weak in circuitry on the SRAM module.

15. The method of claim 5, wherein the information regarding the error correction includes at least one of information about where errors occurred in the data and weak cells within the SRAM module, wherein the information regarding the error correction includes at least one of information about where errors occurred in the data and weak cells within the SRAM module, and wherein writing the information regarding the error correction to the SRAM module comprises storing a list of addresses of bits that are identified as weak in circuitry on the SRAM module.

* * * * *